US006635881B2

(12) United States Patent
Yamada et al.

(10) Patent No.: US 6,635,881 B2

(45) Date of Patent: Oct. 21, 2003

(54) CHARGED-PARTICLE-BEAM PROJECTION-LENS SYSTEM EXHIBITING REDUCED BLUR AND GEOMETRIC DISTORTION, AND MICROLITHOGRAPHY APPARATUS INCLUDING SAME

(75) Inventors: Atsushi Yamada, Yokohama (JP); Hiroyasu Simizu, Kawasaki (JP); Koichi Kamijo, Kawasaki (JP)

(73) Assignee: Nikon Corporation, Tokyo (JP)

( * ) Notice: Subject to any disclaimer, the term of this patent is extended or adjusted under 35 U.S.C. 154(b) by 296 days.

(21) Appl. No.: 09/843,592

(22) Filed: Apr. 26, 2001

(65) Prior Publication Data

US 2001/0038080 A1 Nov. 8, 2001

(30) Foreign Application Priority Data

May 2, 2000 (JP) ....................................... 2000-133590

(51) Int. Cl.[7] ........................... H01J 37/14; H01J 37/21

(52) U.S. Cl. ........................... 250/396 ML; 250/396 R; 250/398; 250/492.22; 250/492.2

(58) Field of Search ..................... 250/396 ML, 396 R, 250/398, 492.22, 492.2

(56) References Cited

U.S. PATENT DOCUMENTS 6,376,842 B1 * 4/2002 Yamada ...................... 250/398

6,545,282 B2 * 4/2003 Simizu .................. 250/492.22

OTHER PUBLICATIONS

Hosokawa et al., "A multistage deflector theory," *Optik* 58, No. 4 (1981) 241–250.

* cited by examiner

*Primary Examiner*—Nikita Wells

(74) *Attorney, Agent, or Firm*—Klarquist Sparkman LLP

(57) ABSTRACT

Charged-particle-beam (CPB) optical systems (especially projection-lens systems for use in CPB microlithography apparatus) are disclosed that exhibit excellent control of geometric aberration and the Coulomb effect while exhibiting low combined aberration and blur. As the column length of the projection-lens system is increased, geometric aberration is reduced but the Coulomb effect increases, which degrades overall optical characteristics. Conversely, as the column length is decreased, the Coulomb effect is reduced but geometric aberration increases, which degrades overall optical characteristics. Hence, the projection-lens system, exhibiting a magnification of 1/M and having a column length (distance in mm between reticle and wafer) of $250 \times M^{0.63} \pm 10\%$ (wherein $0<M$; e.g., $0<M<4$ or $4<M$) exhibits blur and geometric distortion of about 70 nm or less and about 4 nm or less, respectively.

10 Claims, 5 Drawing Sheets

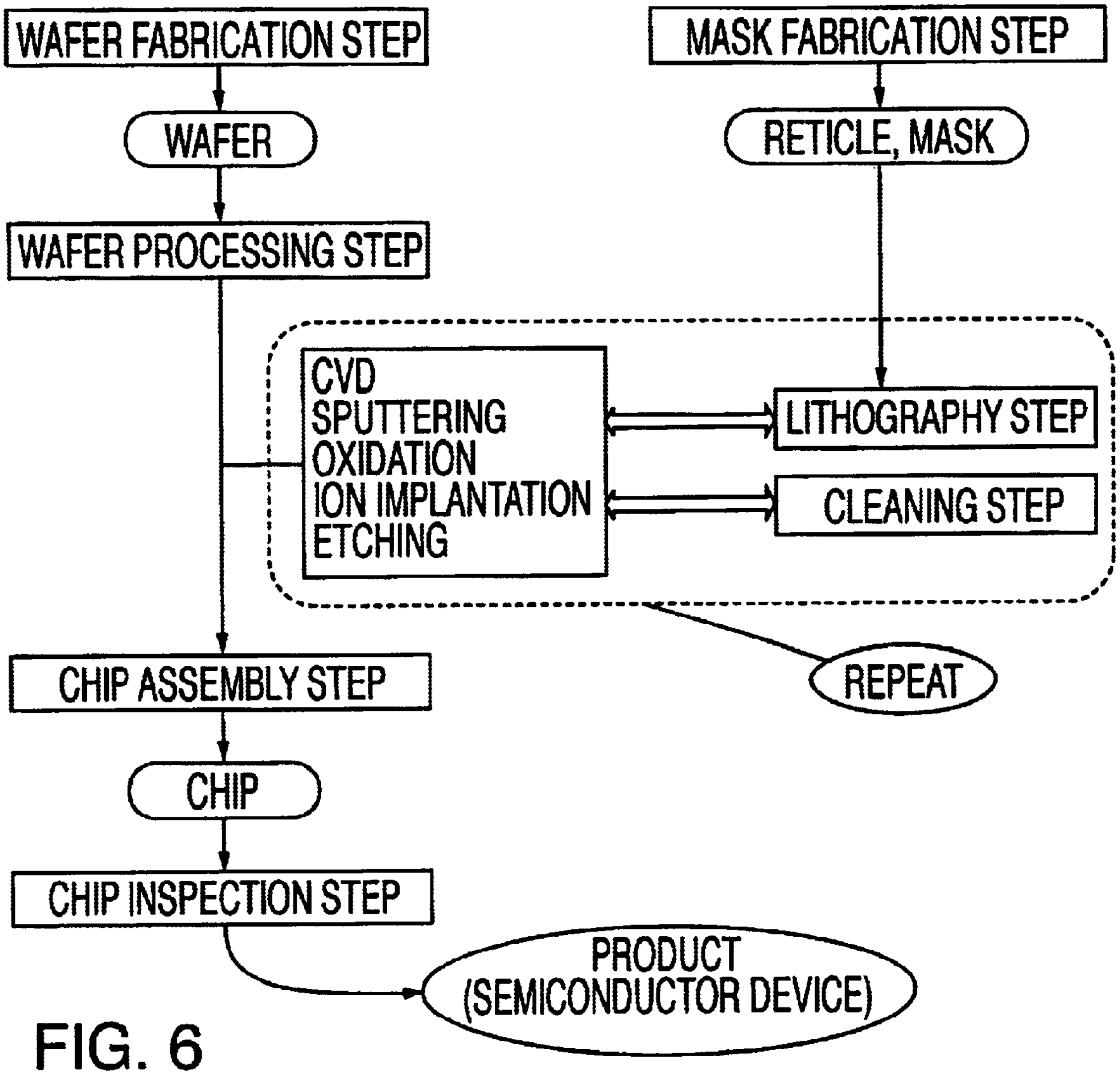
FIG. 6
FIG. 7
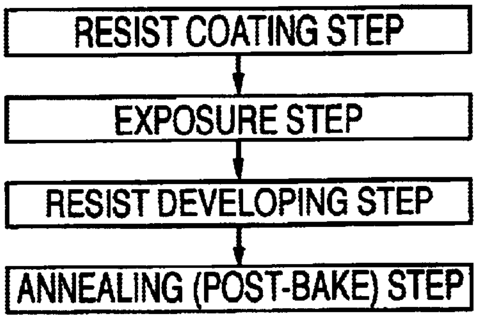

CHARGED-PARTICLE-BEAM PROJECTION-LENS SYSTEM EXHIBITING REDUCED BLUR AND GEOMETRIC DISTORTION, AND MICROLITHOGRAPHY APPARATUS INCLUDING SAME

FIELD OF THE INVENTION

This invention pertains to microlithography (projection-transfer of a pattern, defined on a reticle or mask) to a sensitive substrate using a charged particle beam. Microlithography is a key technique used in the fabrication of microelectronic devices such as integrated circuits, displays, thin-film magnetic pickup heads, and micromachines. More specifically, the invention pertains to configuring a charged-particle-beam (CPB) microlithography column so as to optimize a combination of certain optical parameters.

BACKGROUND OF THE INVENTION

As is well known, the degree of integration and miniaturization of microelectronic devices continues to increase. Fabrication of microelectronic devices also continues to increase in complexity, with a concomitant need for increasingly greater accuracy and precision. As noted above, microlithography is a key technique used in fabrication of microelectronic devices. Microlithography methods that are mostly used today, so-called "optical" microlithography methods, are based upon use of light (especially deep UV light such as produced by an excimer laser) as a microlithographic energy beam. However, despite spectacular refinements in optical microlithography, the maximal resolution obtainable using optical microlithography is limited by the diffraction of light, and current optical microlithography systems operate at or near their theoretical resolution limits.

In the search for ever-greater resolution, several alternative microlithographic approaches have been investigated extensively. For example, considerable attention has been devoted to performing microlithography using an X-ray beam. However, X-ray microlithography currently is impractical due to several reasons including the great difficulty in making X-ray microlithography reticles.

Another approach that has received considerable attention is charged-particle-beam (CPB) microlithography in which pattern transfer is performed using a charged particle beam (e.g., electron beam or ion beam) instead of a beam of light or X-rays. A number of key developments have been made in this field of microlithography, including key developments in the CPB optical systems used such systems. Exemplary developments include MOL (Moving Objective Lens; see Goto et al., *Optik* 48: 255, 1977), VAL (Variable Axis Lens; see Pfeiffer and Langner, *J. Vac. Sci. Technol.* 19:1058, 1981), VAIL (Variable Axis Immersion Lens; see Sturans et al., *J. Vac. Sci. Technol.* B8:1682, 1990). However, despite these developments, and others, optimal performance of CPB microlithography systems has not yet been achieved.

Other theoretically possible approaches to the development of optimal CPB optical systems include one based upon multi-stage deflection theory (see Hosokawa, *Optik* 56:21, 1980). Yet another approach offering prospects of excellent imaging with low distortion or blur utilizes a simple two-stage projection-lens configuration with six deflectors, wherein each deflector is optimized for its intended use (e.g., optimized with respect to inner diameter, angle, excitation current, and position in the CPB column).

The imaging performance of a CPB optical system is affected not only by geometric aberrations and chromatic aberrations addressed by the conventional approaches noted above. Imaging performance also is affected by blur and distortion due to Coulomb interactions between individual charged particles of the beam (this phenomenon is referred to herein as the "Coulomb effect").

SUMMARY OF THE INVENTION

In view of the shortcomings of conventional apparatus and methods as summarized above, an object of the invention is to provide charged-particle-beam (CPB) microlithography apparatus that exhibit satisfactory correction of geometric aberrations and the Coulomb effect and that exhibit low overall aberration and blur. Another object is to provide microelectronic-device manufacturing methods utilizing such CPB microlithography apparatus.

To such ends and according to a first aspect of the invention, CPB microlithography apparatus are provided that direct a shaped charged particle beam (e.g., electron beam) onto a reticle to illuminate a selected region on the reticle and that direct a patterned beam from the reticle to a substrate. A projection-lens system is situated between the reticle and the substrate. According to an exemplary embodiment, the projection-lens system is configured to direct the patterned beam from the reticle to the substrate at a demagnfication ratio of $1/M$, wherein $0<M$. Also, according to the embodiment, the projection-lens system has a column length (in mm) from the reticle to the substrate of $250\times M^{0.63}\pm 10\%$. This expression also is applicable if $0<M<4$.

As the column length is increased, the geometric aberration is observed to be reduced, but the Coulomb effect is observed to increase, generally resulting in deteriorated optical characteristics of the projection-lens system. Conversely, as the column length is decreased, the Coulomb effect is observed to decrease, but the geometric aberration is observed to increase, again generally resulting in deteriorated optical characteristics of the projection-lens system. These observations suggest that there is an optimal column length, in terms of achieving better optical characteristics. The inventors also observed that the column length can be different for any of various projection-lens systems, but that no major divergence in performance occurred even when regarding optimal column length solely as a function of the demagnification ratio of the lens system. If the column length is within the range indicated above, both blur (resulting from a combined effect of geometric aberration and the Coulomb effect) and geometric distortion are excellently reduced (e.g., blur of 70 nm or less and geometric distortion of 4 nm or less).

Desirably, the projection-lens system is a symmetric magnetic doublet comprising a collimating lens and a projection lens. Each of the collimating lens and the projection lens desirably has associated therewith a respective set of at least three deflectors.

According to another aspect of the invention, methods are provided for manufacturing a microelectronic device, wherein each of such methods includes a wafer-processing step performed using a CPB microlithography apparatus as summarized above.

The foregoing and additional features and advantages of the invention will be more readily apparent from the following detailed description, which proceeds with reference to the accompanying drawings.

BRIEF DESCRIPTION OF THE DRAWINGS

FIG. 6 is a process flowchart for manufacturing a microelectronic device, wherein the process includes a microlithography method according to an embodiment of the invention.

FIG. 7 is a process flowchart of a procedure for performing a microlithography method using a projection-exposure apparatus according to an embodiment of the invention.

DETAILED DESCRIPTION

The invention is described below in the context of a representative embodiment that is not intended to be limiting in any way. Also, the invention is described in the context of using an electron beam as a representative charged particle beam. However, the general principles of the invention can be applied with equal facility to use of an alternative charged particle beam, such as an ion beam.

With a charged-particle-beam (CPB) optical system having a fixed deflector region and a fixed size of the exposure unit of the pattern, an axially longer "column" (enclosed, reduced-pressure tube containing the lenses and deflectors constituting the CPB optical system) has been observed to produce reduced geometric aberrations. However, the Coulomb effect is increased. Conversely, an axially shorter column has been observed to exhibit reduced Coulomb effect, but increased geometric aberrations. When both geometric aberrations and the Coulomb effect are considered, the column length is key to minimizing both blur and distortion. In other words, if the column length is not optimized, then excellent optical performance is not obtainable.

Figure 1:
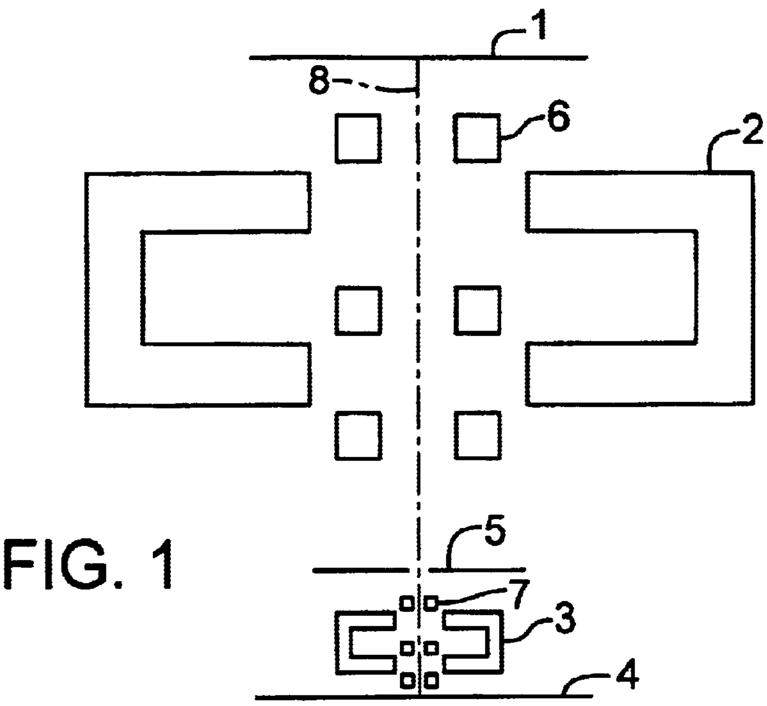
FIG. 1 is a schematic elevational view of a two-stage projection-lens system for use in a charged-particle-beam (CPB) optical system, according to a representative embodiment.

A representative embodiment of a two-stage projection-lens system as used, for example, for electron-beam microlithography is shown in FIG. 1. The projection-lens system is situated between a reticle 1 and a substrate 4. The projection-lens system comprises a collimating lens 2, a projection lens 3, an aperture 5, a first deflector array 6, and a second deflector array 7, all arranged along an optical axis 8. The first deflector array 6 is associated with the collimating lens 2, and the second deflector array 7 is associated with the projection lens 3.

For projection, a region (usually termed a "subfield") of the reticle 1 is "illuminated" by an upstream "illumination beam" that is not shown but well understood in the art. As the illumination beam passes through the illuminated region, the beam acquires an ability to form an image, on the substrate 4, of the illuminated region.

For projection of the image, the lenses 2, 3 are arranged as a "symmetric magnetic doublet" (SMD) lens system. The image projected by the SMD lens system is "demagnified," by which is meant that the image is smaller (usually by an integer factor M, wherein M is 4, 5, or 6, for example) than the illuminated region. Thus, the SMD lens system has a "demagnification ratio" of 1/M. The aperture 5 limits the aperture angle of the electron beam incident on the substrate 4, and is situated such that the electron beam carrying the image from the reticle 1 to the substrate 4 has M:1 SMD symmetry, centered on the aperture 5.

In the embodiment of FIG. 1, the optical axis 8 is the Z-axis. By way of example, and not intending to be limiting in any way, the beam aperture angle is 6 mrad, the subfield size is (0.25 mm×0.25 mm), and the optical field at the substrate (representing the maximum range of beam deflection at the reticle) is 2.375 mm×0.375 mm. Also, the electron-beam current is 24 μA, the beam energy is 100 keV, and the beam-energy spread is 5 eV.

Figure 2:
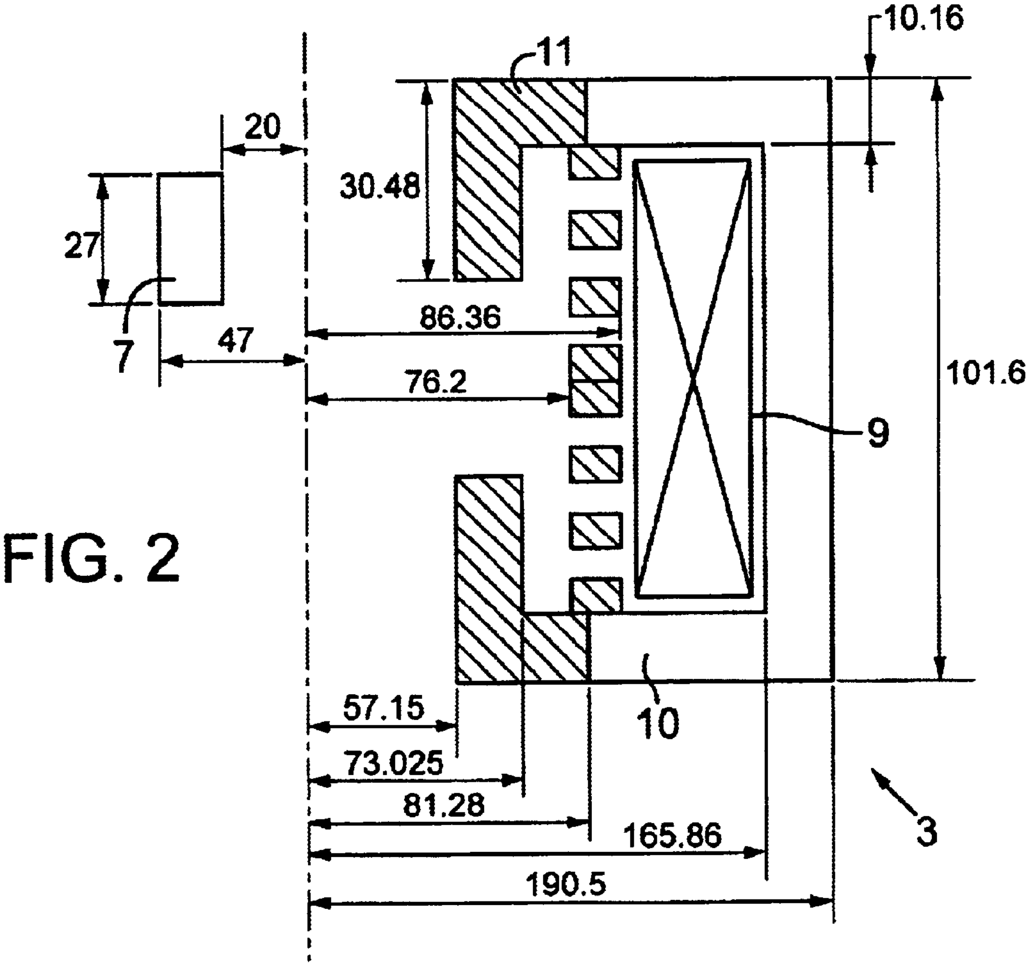
FIG. 2 is a sectional elevational view of the projection lens 3 in FIG. 1, along with certain exemplary dimensions as used in a projection-lens system having a demagnification ratio of ¼.

FIG. 2 depicts an exemplary configuration of the projection lens 3. Also shown are exemplary dimensions and position data concerning one of the deflectors 7, assuming a column length L=600 mm (as measured along the optical axis 8 from the reticle 1 to the substrate 4) and a demagnification ratio 1/M=¼. In FIG. 2, item 9 is the electrical coil of the lens 3, item 10 is the outer pole casement (typically made of mild steel), and item 11 (shaded) is the inner casement (typically made of ferrite).

With a demagnification ratio of 1/M and a column length of L, the dimensions of the projection lens 3 are reduced by a factor L/[(1+M)×120]. For example, if M=4 and L=600 mm (FIG. 2), then L/[(1+M)×120]=1; this means that each dimension of the lens 3 in this situation is unchanged. However, if M=5 and L=600 mm, then L/[(1+M)×120]=0.8333; this means that each dimension of the lens 3 in this situation is reduced by a factor of 0.8333. In the latter situation the deflector 7 has similarly reduced dimensions.

Corresponding dimensions of the collimator lens 2 are larger (by M) than respective dimensions of the projection lens 3. With respect to the collimator lens 2 shown in FIG. 2, wherein M=4 and L=600 mm, each dimension is reduced by L×M/[(1+M)×120], but each dimension remains M times larger than corresponding dimensions of the lens 3. For example, if M=4 and L=600 mm, L×M/[(1+M)120]=4. The dimensions of the deflector 6 are similarly larger than corresponding dimensions of the deflector 7.

To facilitate obtaining an optimal lens-column length, three deflectors 6 were disposed on the collimating lens side, and three deflectors 7 were disposed on the projection-lens side of the aperture 5, as shown in FIG. 1. The respective positions and excitation currents applied to the deflectors were optimized to achieve the best imaging results. Blur was calculated from geometric and chromatic aberrations and Coulomb interactions in the optical system, yielding the data plotted in FIGS. 3, 4, and 5 for demagnification (1/M) ratios of ⅙, ⅛, and 1/10, respectively. The plot of circles denotes blur due to geometric and chromatic aberrations; the plot of squares denotes blur due to the Coulomb effect; the plot of triangles denotes blur due to a combination of geometric aberrations, chromatic aberrations, and the Coulomb effect; and the plot of X's denotes geometric distortion. The unlabeled solid line denotes blur due to a combination of geometric and chromatic aberrations and the Coulomb effect with L=600 mm and 1/M=¼; and the unlabeled dashed line denotes geometric distortion with L=600 mm and 1/M=¼.

Figure 3:
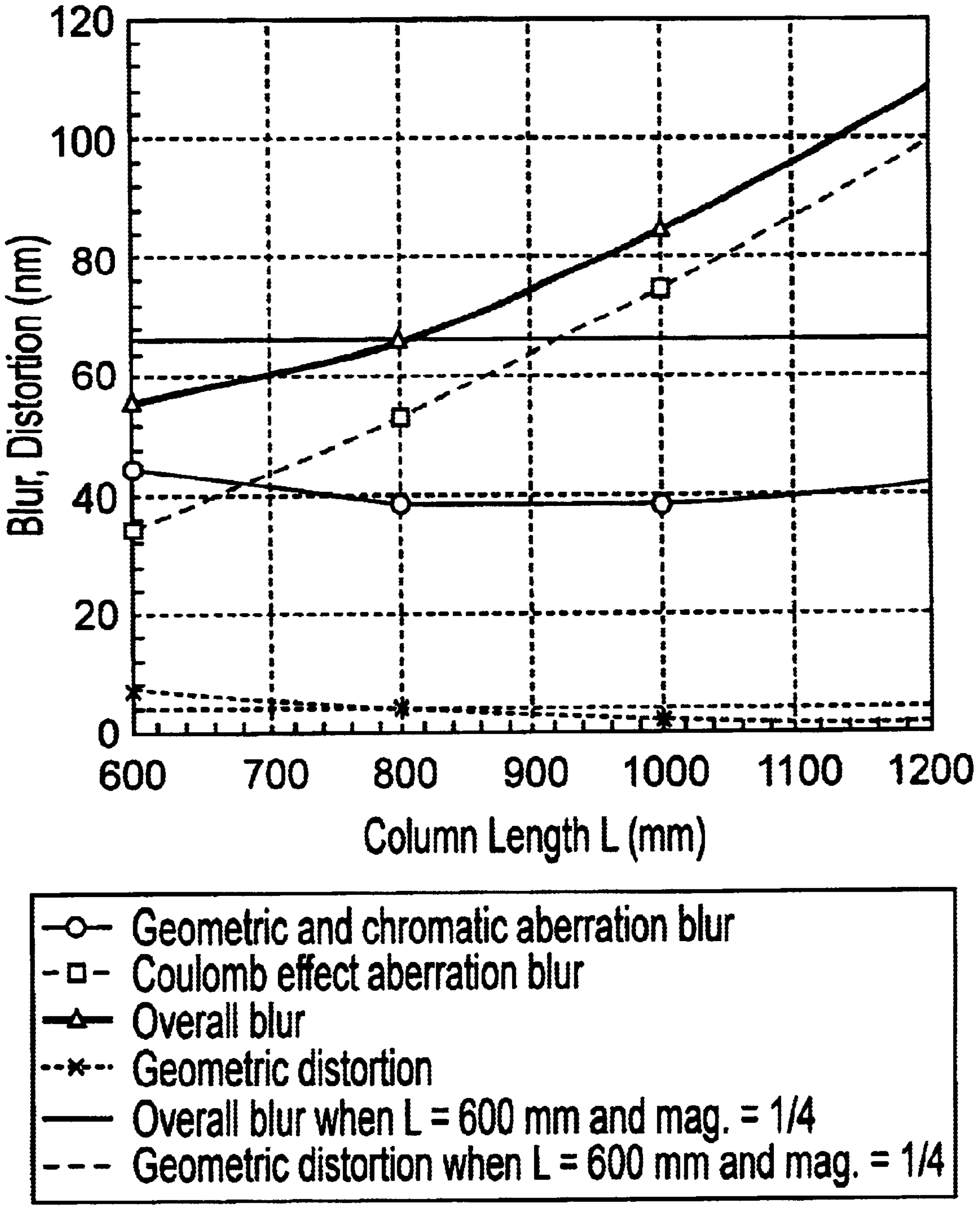
FIG. 3 is a plot of blur and geometric distortion exhibited by a projection-lens system, according to the invention, having a ⅙ demagnification ratio.
Figure 4:
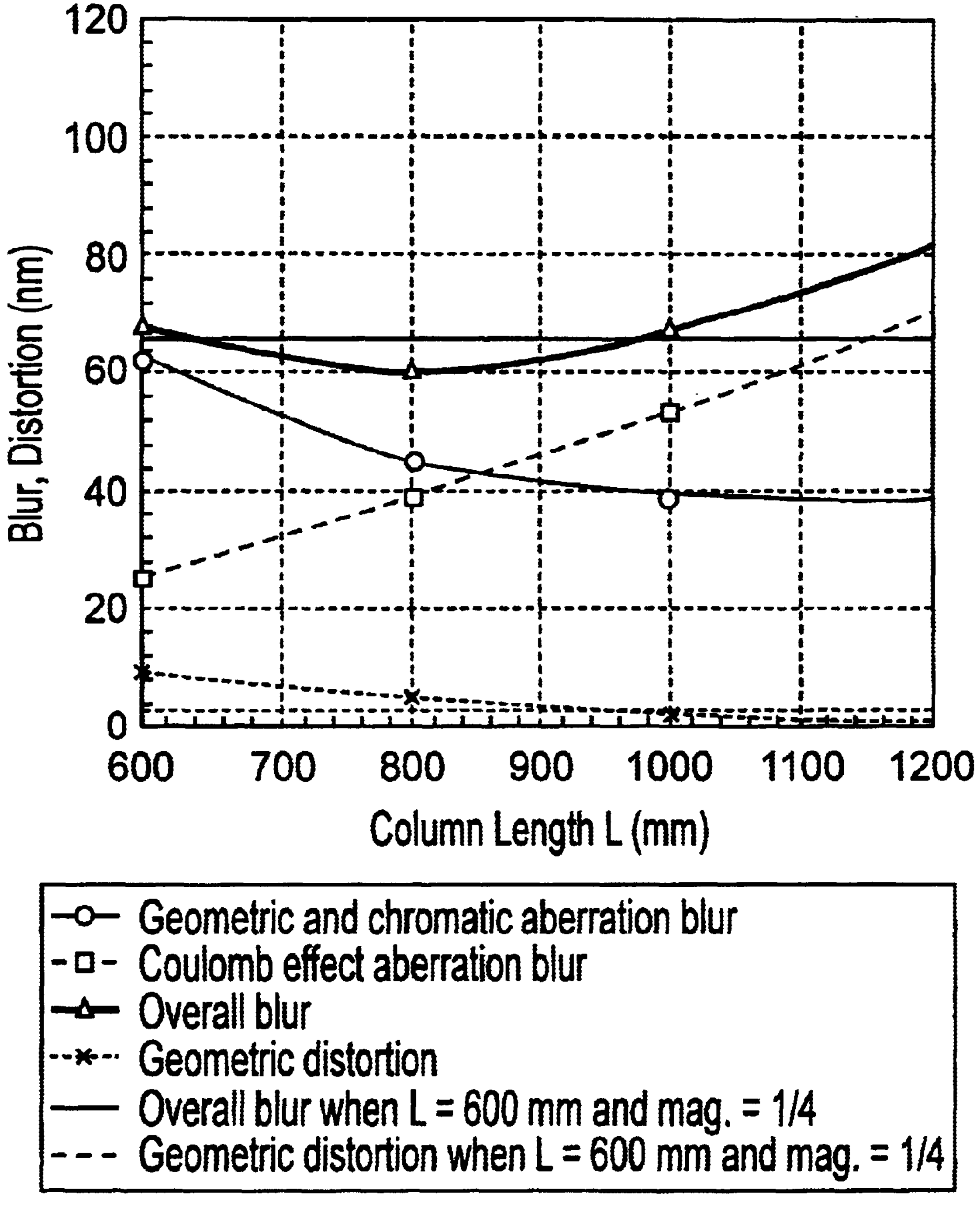
FIG. 4 is a plot of blur and geometric distortion exhibited by a projection-lens system, according to the invention, having a ⅛ demagnification ratio.
Figure 5:
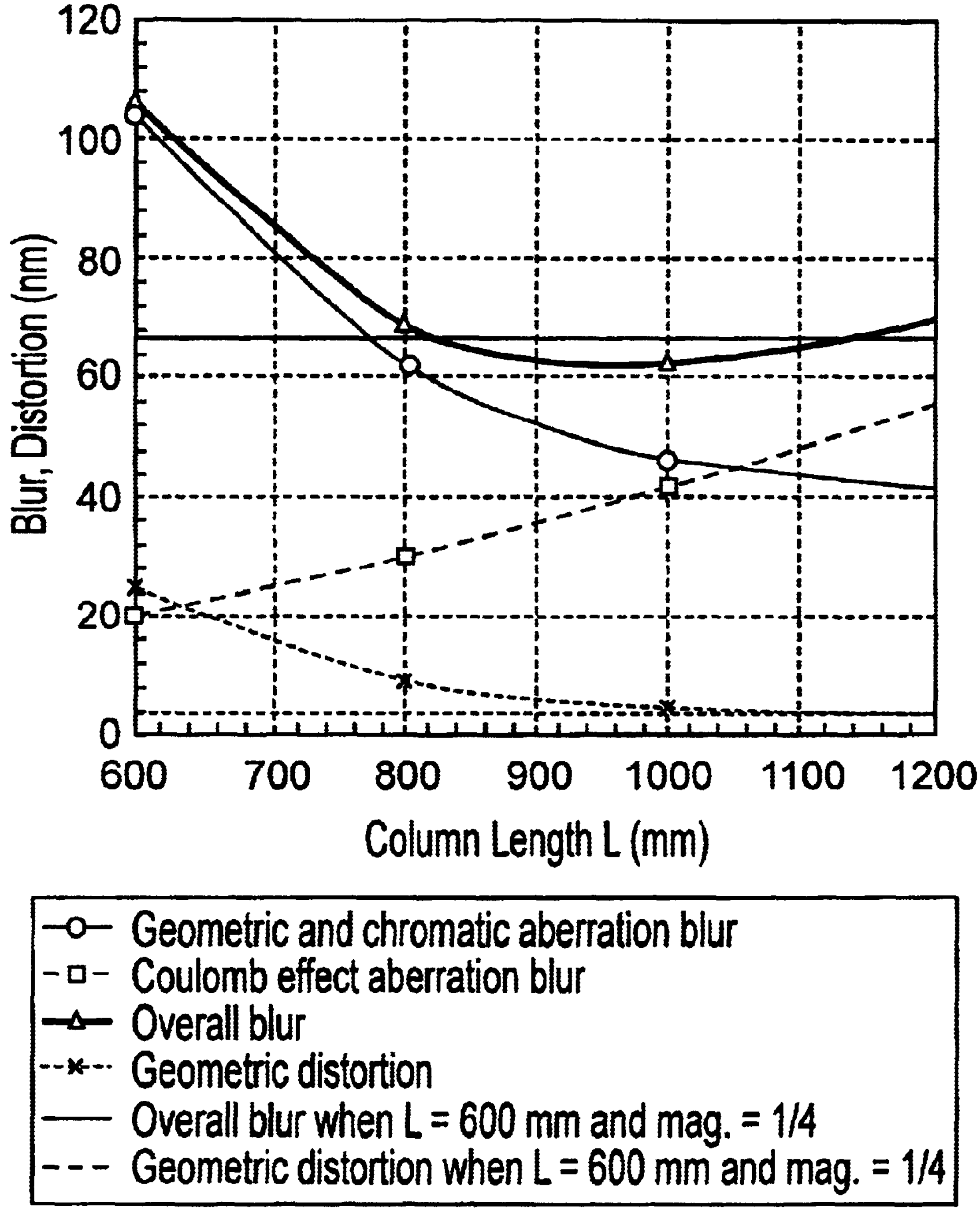
FIG. 5 is a plot of blur and geometric distortion exhibited by a projection-lens system, according to the invention, having a 1/10 demagnification ratio.

Achievable blur and geometric distortion in a conventional ¼ demagnifying lens system are about 70 nm or less and about 4 nm or less, respectively, as indicated by the unlabeled solid line and the unlabeled dashed line, respectively, in FIGS. 3–5. Under such conditions, the determined nominal column lengths are 800 mm at ⅙ demagnification (FIG. 3), 920 mm at ⅛ demagnification (FIG. 4), and 1110 mm at 1/10 demagnification (FIG. 5). These results agree with the general expression $L=250\times M^{0.63}$ mm.

It was also found that the permissible variation (tolerance) in the column length is ±10% under conditions in which the lens profiles and the like are varied in a practical range. Hence, it was determined that the optimal column length (in mm) is expressed as $L=250\times M^{0.63}\pm10\%$.

FIG. 6 is a flowchart of an exemplary microelectronic-fabrication method in which apparatus and methods according to the invention can be applied readily. The fabrication method generally comprises the main steps of wafer production (wafer manufacturing or preparation), reticle (mask) production or preparation; wafer processing, device (chip) assembly (including dicing of chips and rendering the chips operational), and device (chip) inspection. Each step usually comprises several sub-steps.

Among the main steps, wafer processing is key to achieving the smallest feature sizes (critical dimensions) and best inter-layer registration. In the wafer-processing step, multiple circuit patterns are layered successively atop one another on the wafer, forming multiple chips destined to be memory chips or main processing units (MPUs), for example. The formation of each layer typically involves multiple sub-steps. Usually, many operative microelectronic devices are produced on each wafer.

Typical wafer-processing steps include: (1) thin-film formation (by, e.g., sputtering or CVD) involving formation of a dielectric layer for electrical insulation or a metal layer for connecting wires or electrodes; (2) oxidation step to oxidize the substrate or the thin-film layer previously formed; (3) microlithography to form a resist pattern for selective processing of the thin film or the substrate itself; (4) etching or analogous step (e.g., dry-etching) to etch the thin film or substrate according to the resist pattern; (5) doping as required to implant ions or impurities into the thin film or substrate according to the resist pattern; (6) resist stripping to remove the remaining resist from the wafer; and (7) wafer inspection. Wafer processing is repeated as required (typically many times) to fabricate the desired microelectronic devices on the wafer.

FIG. 7 provides a flowchart of typical steps performed in microlithography, which is a principal step in the wafer processing step shown in FIG. 6. The microlithography step typically includes: (1) resist-application step, wherein a suitable resist is coated on the wafer substrate (which an include a circuit element formed in a previous wafer-processing step); (2) exposure step, to expose the resist with the desired pattern by microlithography; (3) development step, to develop the exposed resist to produce the imprinted image; and (4) optional resist-annealing step, to enhance the durability of and stabilize the resist pattern.

The process steps summarized above are all well known and are not described further herein.

Whereas the invention has been described in connection with a representative embodiment, it will be understood that the invention is not limited to that embodiment. On the contrary, the invention is intended to encompass all modifications, alternatives, and equivalents as may be included within the spirit and scope of the invention, as defined by the appended claims.

What is claimed is:

1. In a charged-particle-beam (CPB) microlithography apparatus that directs a shaped charged particle beam onto a reticle to illuminate a selected region on the reticle and that directs the beam from the reticle to a substrate to form an image of the illuminated region of the reticle on the substrate, a projection-lens system situated between the reticle and the substrate and configured to direct the beam from the reticle to the substrate at a demagnfication ratio of 1/M (0<M), the projection-lens system having an optimum column length in mm from the reticle to the substrate of $250\times M^{0.63}\pm10\%$, where M is the magnification factor.

2. The apparatus of claim 1, wherein the charged particle beam is an electron beam.

3. The apparatus of claim 1, wherein the projection-lens system is a symmetric magnetic doublet comprising a collimating lens and a projection lens.

4. The apparatus of claim 3, wherein each of the collimating lens and the projection lens has associated therewith a respective set of at least three deflectors.

5. The apparatus of claim 1, exhibiting a blur of 70 nm or less and a geometric distortion of 4 nm or less.

6. The apparatus of claim 1, wherein 0<M<4).

7. The apparatus of claim 6, wherein the projection-lens system is a symmetric magnetic doublet comprising a collimating lens and a projection lens.

8. The apparatus of claim 7, wherein each of the collimating lens and the projection lens has associated therewith a respective set of at least three deflectors.

9. The apparatus of claim 6, exhibiting a blur of 70 nm or less and a geometric distortion of 4 nm or less.

10. The apparatus of claim 6, wherein the charged particle beam is an electron beam.

* * * * *

UNITED STATES PATENT AND TRADEMARK OFFICE

CERTIFICATE OF CORRECTION

PATENT NO. : 6,635,881 B2
DATED : October 21, 2003
INVENTOR(S) : Yamada et al.

It is certified that error appears in the above-identified patent and that said Letters Patent is hereby corrected as shown below:

<u>Column 1,</u>
Line 50, "used such systems" should read -- used in such systems --

<u>Column 5,</u>
Lines 47-48, "an include" should read -- can include --

<u>Column 6,</u>
Line 37, "0<M<4)." should read -- 0<M<4. --

Signed and Sealed this

Ninth Day of November, 2004

JON W. DUDAS
*Director of the United States Patent and Trademark Office*